United States Patent
Reise

(10) Patent No.: US 9,614,521 B2
(45) Date of Patent: Apr. 4, 2017

(54) PUSH-BUTTON SWITCH HAVING CAPACITIVE AND MECHANICAL FUNCTIONALITY

(75) Inventor: Wulf Reise, Constance (DE)

(73) Assignee: TRW Automotive Electronics & Components GmbH (DE)

( * ) Notice: Subject to any disclaimer, the term of this patent is extended or adjusted under 35 U.S.C. 154(b) by 1004 days.

(21) Appl. No.: 13/383,269

(22) PCT Filed: Jul. 2, 2010

(86) PCT No.: PCT/EP2010/004016
§ 371 (c)(1),
(2), (4) Date: Apr. 19, 2012

(87) PCT Pub. No.: WO2011/003555
PCT Pub. Date: Jan. 13, 2011

(65) Prior Publication Data
US 2012/0199459 A1 Aug. 9, 2012

(30) Foreign Application Priority Data
Jul. 10, 2009 (DE) .................. 10 2009 032 634

(51) Int. Cl.
*H03K 17/975* (2006.01)
*H03K 17/96* (2006.01)
*H01H 13/705* (2006.01)
*H01H 3/02* (2006.01)

(52) U.S. Cl.
CPC ......... *H03K 17/962* (2013.01); *H01H 13/705* (2013.01); *H01H 2003/0293* (2013.01); *H01H 2203/038* (2013.01); *H01H 2239/006* (2013.01); *H03K 2017/9613* (2013.01); *H03K 2217/96054* (2013.01); *H03K 2217/960755* (2013.01)

(58) Field of Classification Search
USPC ................... 200/5 A, 600; 361/288
See application file for complete search history.

(56) References Cited

U.S. PATENT DOCUMENTS

| | | | |
|---|---|---|---|
| 5,270,710 A | 12/1993 | Gaultier et al. | |
| 6,140,593 A | 10/2000 | Bramesfeld et al. | |
| 7,166,813 B2 | 1/2007 | Soma et al. | |
| 7,935,904 B2 * | 5/2011 | Song ........................ | 200/310 |

(Continued)

FOREIGN PATENT DOCUMENTS

| | | |
|---|---|---|
| DE | 69121858 | 1/1997 |
| DE | 19839811 | 3/2000 |

(Continued)

*Primary Examiner* — Vanessa Girardi
(74) *Attorney, Agent, or Firm* — Tarolli, Sundheim, Covell & Tummino LLP

(57) ABSTRACT

A pushbutton switch has a pressure switching function to recognize a key actuation and a capacitive sensor function to recognize a key touch. It has an at least partly electrically conductive key (12) and a printed circuit board (16) which includes at least one electrical contact (18) that is activated by depressing the key (12) via a switching mat (22) arranged between the key (12) and the printed circuit board (16). The printed circuit board (16) also has at least one capacitive sensor surface (20) located opposite to and at a distance from the key (12), with a capacitive coupling existing between the key (12) and the sensor surface (20).

9 Claims, 1 Drawing Sheet

(56) References Cited

U.S. PATENT DOCUMENTS

| | | |
|---|---|---|
| 2001/0025778 A1 | 10/2001 | Ono |
| 2006/0113178 A1 | 6/2006 | Soma et al. |
| 2008/0094373 A1 | 4/2008 | Song |
| 2008/0257707 A1* | 10/2008 | Murase et al. ............... 200/600 |
| 2009/0008234 A1 | 1/2009 | Tolbert et al. |
| 2009/0128511 A1 | 5/2009 | Sinclair et al. |

FOREIGN PATENT DOCUMENTS

| | | |
|---|---|---|
| DE | 102005025021 | 12/2006 |
| EP | 1635366 | 3/2006 |
| EP | 1758135 | 2/2007 |
| JP | 2008 282724 | 11/2008 |
| JP | 2008-282724 | 11/2008 |
| JP | 2008289058 | 11/2008 |
| JP | 2009 146707 | 7/2009 |
| JP | 2001 283679 | 10/2012 |
| KR | 20080064260 | 7/2008 |

\* cited by examiner

PUSH-BUTTON SWITCH HAVING CAPACITIVE AND MECHANICAL FUNCTIONALITY

RELATED APPLICATIONS

This application corresponds to PCT/EP2010/004016, filed Jul. 2, 2010, which claims the benefit of German Application No. 10 2009 032 634.0, filed Jul. 10, 2009, the subject matter, of which are incorporated herein by reference in their entirety.

BACKGROUND OF THE INVENTION

The present invention relates to a pushbutton switch in which both an actuation of the key and a touch of the key is detected.

Pushbutton switches of this type are employed, for example, in telephone keypads or control panels having several keys.

Pushbutton switches are known which include an elastic switching mat that acts on a subjacent contact on a printed circuit board and in this way closes a circuit in a mechanical manner when the key is actuated. The touch recognition of the key, on the other hand, may be effected capacitively, a sensor surface being applied on the inside of the key cap, for example, which is connected to an electronic evaluation unit by means of sliding contacts or lines. A drawback here is that the sensor surface needs to follow the movement of the key and the electrical connections are very involved in terms of process engineering and, in addition, are prone to error.

SUMMARY OF THE INVENTION

It is the object of the present invention to simplify a pushbutton switch of the type mentioned at the outset and to allow it to be manufactured at lower cost.

To this end, a pushbutton switch having a pressure switching function to recognize a key actuation and a capacitive sensor function to recognize a key touch includes an at least partly electrically conductive key and a printed circuit board which includes at least one electrical contact that is activated by depressing the key via a switching mat arranged between the key and the printed circuit board. The printed circuit board further includes at least one capacitive sensor surface located opposite to and at a distance from the key, with a capacitive coupling existing between the key and the sensor surface. Thus, according to the invention the sensor surface is arranged directly on the printed circuit board, so that the bonding of the key for signal evaluation can be dispensed with. The capacitive coupling between the capacitive sensor surface and the touch surface of the key may be already achieved solely in that the key is made to be at least partly electrically conductive. A change in capacitance caused by touching the key can therefore be detected by the capacitive sensor surface.

In this case, the entire electrical bonding and the connection to the electronic evaluation unit can be effected completely via the printed circuit board. A connection between the key and the printed circuit board by means of sliding contacts or cables may be dispensed with.

The key body itself is preferably made from a plastic material in the present case. In order to configure the key to be conductive, the key is preferably provided with a conductive coating. For example, the key may be chromium-plated or plated with some other metal, e.g., in an electro-plating process. It is, of course, also possible to manufacture the key at least in part from an electrically conductive plastic material which has, for example, carbon particles incorporated therein.

The coating is preferably provided at least at a touch surface of the key so as to achieve a sufficient capacitive effect when a user touches the key. It is, however, of advantage to make the key fully electrically conductive, either by completely coating it with an electrically conductive coating or by manufacturing the entire key from a plastic material that is per se electrically conductive.

Preferably, the conductive coating extends at least as far as to an area on the lower side of the key which is in contact with the switching mat.

Advantageously, the switching mat is configured to be electrically conductive on its upper side and/or on its lower side to increase the capacitive coupling. This may be achieved by a conductive varnish, for example. In particular in combination with a conductive coating of the entire key, the electrically conducting connection between the touch surface of the key and the capacitive sensor surface is then only interrupted by the thickness of the material of the switching mat and by the distance of the switching mat from the sensor surface. Thus, there is preferably no electrically conducting connection from the upper side of the switching mat to the lower side thereof, but only a capacitive coupling. It has been found that in this way, a very good capacitive coupling may be obtained between the capacitive sensor surface and the touch surface of the key.

The switching mat may be of a closed design, so that it has no openings on its surface. As a result of this, the switching mat also provides protection of the elements underneath against environmental influences such as moisture, mechanical damage, or electrostatic discharges.

In a preferred embodiment, a snap disk is arranged between the printed circuit board and the switching mat and above the electrical contact, the snap disk closing an electric circuit when the pressure switching function is exercised, as is known from a conventional design of a pushbutton switch having a switching mat.

Instead of a snap disk, it is also possible to provide a known meander/contact pill combination to realize the pressure switching function.

The contact arrangement on the printed circuit board may be, for example, selected such that the electrical contact of the pressure switching function is surrounded by the capacitive sensor surface. The two contacts are electrically insulated from each other to obtain a clear separation of the triggering signal. It is possible, however, to keep the snap disk at the same potential as the sensor surface and to provide an electronic evaluation unit which is adapted to distinguish the differences in potential that are produced when the key is touched or actuated, and can determine the type of activation.

Further features and advantages of the invention will be apparent from the description below of an exemplary embodiment in conjunction with the accompanying drawings, in which:

DESCRIPTION OF AN EXEMPLARY EMBODIMENT

Figure 1:
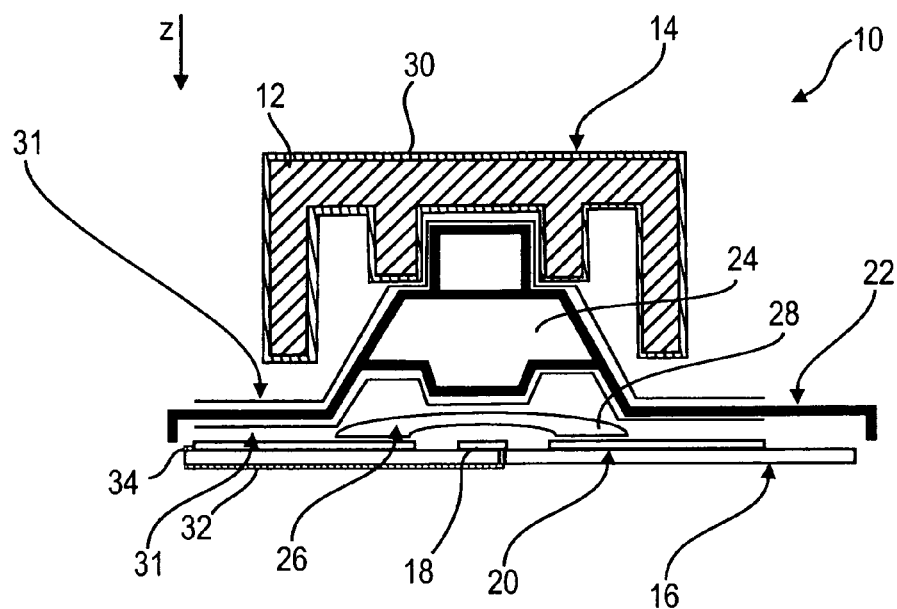
FIG. 1 shows a schematic sectional view of a pushbutton switch according to the invention.

FIG. 1 shows a pushbutton switch 10 which may be part of a keypad having a plurality of similar or different pushbutton switches, for example. The pushbutton switch 10 may also be employed in an operating panel having one or more keys such as, e.g., in a telephone or in an operating panel in a vehicle instrument panel. Other applications are, of course, also conceivable.

The pushbutton switch 10 includes a key 12 which in this example consists of a key cap made in one piece of a plastic material. On its upper side the key 12 has a touch surface 14 on which a user operates the key 12 with a finger, either to only touch the key 12 or to depress the key 12 in the z-direction for actuation.

Figure 2:
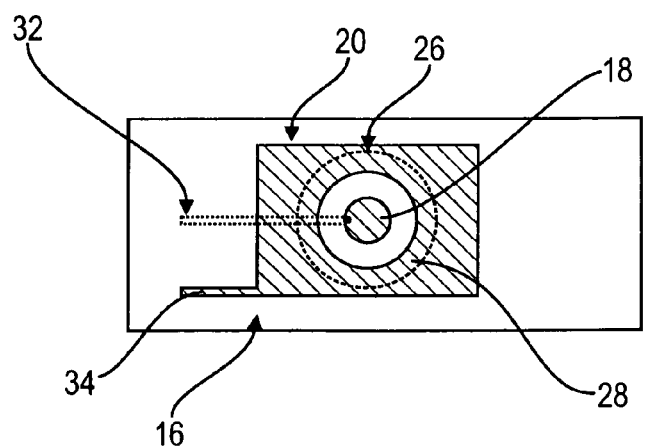
FIG. 2 schematically shows the contact arrangement of the pushbutton switch of FIG. 1 in a top view.

In the z-direction below the key 12 there is located a printed circuit board 16 which includes an electrical contact 18 centrally below the key 12, and a capacitive sensor surface 20 opposite the key 12 in the z-direction which concentrically surrounds the electrical contact 18, as illustrated in FIG. 2.

Arranged between the printed circuit board 16 and the key 12 is a switching mat 22 which extends across the printed circuit board 16 as a closed surface, with a single, planar continuous switching mat 22 being preferably provided for all of the keys 12 in the keypad or in the operating panel. In the region of the key 12, the switching mat 22 includes a switching dome 24 which is geometrically adapted to the shape of the lower side of the key 12 such that the key 12 is securely locked in place on the switching dome 24. The exact shaping may be adopted from any known switching mats.

A snap disk 26 is arranged between the switching mat 22, more precisely between the switching dome 24 and the printed circuit board 16 or the electrical contact 18 such that its curvature faces away from the electrical contact 18. The snap disk 26 is configured and arranged such that its center is located above the electrical contact 18 while its edge region 28 is arranged above the capacitive sensor surface 20. Its center is spaced away from the electrical contact 18.

The key 12 is designed to be electrically conductive. In the example shown, it is fully plated with a metallic coating 30, for example a chromium layer.

In the region of the key 12, the switching mat 22 is provided with an electrically conductive coating 31 both on its upper side and on its lower side. There is thus a continuous electrically conductive connection from the touch surface 14 of the key 12 to the conductive coating 31 of the upper side of the switching mat 22 (in the drawing, the key 12 and the switching mat 22 are shown at a distance for reasons of illustration). The coating in the region of the lower side of the switching mat 22 is also arranged above the capacitive sensor surface 20 on the printed circuit board 16, as can be seen in FIG. 1. In this way, a capacitive coupling is reached between the touch surface 14 and the capacitive sensor surface 20, by means of which a touch of the key 12 may be detected by a change in the capacitance or in the potential across the capacitive sensor surface 20. This detection is performed by an electronic evaluation unit (not shown). This electronic evaluation unit may be designed such that it also recognizes and evaluates a conventional key actuation by pressing in the z-direction via the pressure switching function at the same time.

For the pressure switching function, the user depresses the key 12 in the z-direction, for example by pressing on the touch surface 14, so that the switching dome 24 presses onto the center of the snap disk 26 to bend it in the z-direction, so that the central region of the snap disk 26 touches the electrical contact 18. At the same time, the edge region 28 is pressed onto the capacitive sensor surface 20 to allow a flow of current between the capacitive sensor surface 20 and the electrical contact 18. Closing of this circuit is detected by the electronic evaluation unit and interpreted as a key actuation. The electrical contact 18 is bonded through the printed circuit board with a conductor track 32 on the lower side of the printed circuit board 16, as is illustrated in FIG. 2. The connection of the capacitive sensor surface 20, on the other hand, is effected via a conductor track 34 on the upper side of the printed circuit board 16.

Both the electrical contact 18 and the capacitive sensor surface 20 may be formed by copper surfaces on the printed circuit board 16, but it is also possible to provide a gold coating at this point to prevent corrosion.

It is possible to configure the key 12 to be only partly conductive, a conductivity being preferably provided in the region of the touch surface 14. A conductivity on the lower side of the key 12 is also of advantage. The conductivity may be obtained by making provision for an electrically conductive coating, such as, e.g., a chromium-plating or plating with some other metal, but also by making the key in full or in part of a plastic material which is electrically conductive per se.

The invention claimed is:

1. A pushbutton switch having
a pressure switching function to recognize a key actuation, and
a capacitive sensor function to recognize a key touch,
comprising an at least partly electrically conductive key (12), and
a printed circuit board (16) which includes at least one electrical contact (18) that is activated by depressing the key (12) via a switching mat (22) arranged between the key (12) and the printed circuit board (16),
and which printed circuit board (16) has at least one capacitive sensor surface (20) located opposite to and at a distance from the key (12), with a capacitive coupling existing between the key (12) and the sensor surface (20).

2. The pushbutton switch according to claim 1, wherein the switching mat (22) is of a closed design.

3. The pushbutton switch according to claim 1, wherein a snap disk (26) is arranged above the electrical contact (18), between the printed circuit board (16) and the switching mat (22), the snap disk (26) closing an electric circuit when the pressure switching function is exercised.

4. The pushbutton switch according to claim 1, wherein the electrical contact (18) is surrounded by the capacitive sensor surface (20).

5. The pushbutton switch according to claim 1, wherein the switching mat (22) is configured to be electrically conductive on its upper side and/or on its lower side.

6. The pushbutton switch according to claim 5, wherein no electrically conducting connection exists from the upper side of the switching mat (22) to the lower side of the switching mat (22).

7. The pushbutton switch according to claim 1, wherein the key (12) is provided with a conductive coating (30).

8. The pushbutton switch according to claim 7, wherein the coating (30) is provided at a touch surface (14) of the key (12).

9. The pushbutton switch according to claim 7, wherein the conductive coating (30) extends as far as to an area on the lower side of the key (12) which is in contact with the switching mat (22).

* * * * *